(12) United States Patent
Li et al.

(10) Patent No.: US 12,089,346 B2
(45) Date of Patent: Sep. 10, 2024

(54) DIE PACKAGE STRUCTURE AND METHOD FOR FABRICATING THE SAME

(71) Applicant: REALTEK SEMICONDUCTOR CORP., Hsinchu (TW)

(72) Inventors: Hai-Tao Li, Suzhou (CN); Hong-Hai Dai, Suzhou (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 216 days.

(21) Appl. No.: 17/742,510

(22) Filed: May 12, 2022

(65) Prior Publication Data
US 2023/0232543 A1 Jul. 20, 2023

(30) Foreign Application Priority Data
Jan. 20, 2022 (CN) .......................... 202210068100.2

(51) Int. Cl.
| | |
|---|---|
| H05K 1/14 | (2006.01) |
| H05K 1/02 | (2006.01) |
| H05K 1/11 | (2006.01) |
| H05K 1/18 | (2006.01) |

(Continued)

(52) U.S. Cl.
CPC .......... *H05K 3/361* (2013.01); *H05K 1/0268* (2013.01); *H05K 1/111* (2013.01); *H05K 1/147* (2013.01); *H05K 1/189* (2013.01); *H05K 3/3426* (2013.01); *H05K 3/3436* (2013.01); *H05K 2201/056* (2013.01); *H05K 2201/094* (2013.01)

(58) Field of Classification Search
CPC ........ H05K 1/028; H05K 1/118; H05K 1/147; H05K 1/189; H05K 3/361; H05K 1/0268; H05K 2201/042; H05K 2201/05; H05K 2201/058; H05K 1/111; H05K 3/3426; H05K 3/3436; H05K 2201/094; H05K 2201/056; H01L 23/5387; H01L 25/0657; H01L 23/04; H01L 23/10; H01L 23/12; H01L 23/5386; H01L 25/07; H01L 25/18
See application file for complete search history.

(56) References Cited

U.S. PATENT DOCUMENTS

| | | | |
|---|---|---|---|
| 5,530,288 A * | 6/1996 | Stone ..................... | H05K 1/162 |
| | | | 257/E23.079 |
| 6,562,641 B1 * | 5/2003 | Freeman ............. | H01L 23/4985 |
| | | | 438/18 |

(Continued)

*Primary Examiner* — Steven T Sawyer
(74) *Attorney, Agent, or Firm* — Li& Cai Intellectual Property (USA) Office

(57) ABSTRACT

A die package structure and a method for fabricating the same are provided. The method includes: fixing a first die on a package base; aligning first hollow pads of a flexible printed circuit board with first pads of the first die, and fixing the flexible printed circuit board; soldering the first hollow pads to the first pads; fixing a second die on the flexible printed circuit board to overlap with the first die; folding the flexible printed circuit board, such that second hollow pads of the flexible printed circuit board are aligned with second pads of the second die, and signal test pads of the flexible printed circuit board are exposed; fixing the flexible printed circuit board on the second die; soldering the second hollow pads to the second pads; soldering metal wires to the signal test soldering pads; and soldering package pins to the metal wires.

16 Claims, 11 Drawing Sheets

(51) Int. Cl.
    *H05K 3/34*    (2006.01)
    *H05K 3/36*    (2006.01)

(56) References Cited

U.S. PATENT DOCUMENTS

| | | | |
|---|---|---|---|
| 7,009,293 B2 * | 3/2006 | Hashimoto | H01L 23/49816 |
| | | | 257/730 |
| 2004/0115866 A1 * | 6/2004 | Bang | H01L 25/0657 |
| | | | 257/E25.023 |
| 2004/0238931 A1 * | 12/2004 | Haba | H01L 23/5387 |
| | | | 257/E23.177 |
| 2023/0176108 A1 * | 6/2023 | Cho | H01L 23/3171 |
| | | | 257/48 |

* cited by examiner

DIE PACKAGE STRUCTURE AND METHOD FOR FABRICATING THE SAME

CROSS-REFERENCE TO RELATED PATENT APPLICATION

This application claims the benefit of priority to China Patent Application No. 202210068100.2 in People's Republic of China, filed on Jan. 20, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure and a method for fabricating the same, and more particularly to a die package structure and a method for fabricating the same.

BACKGROUND OF THE DISCLOSURE

Putting multiple dies into one package is a relatively common packaging method. However, such packaging methods for dies often involve large package sizes and high costs, on top of the problem that signals of the dies often cannot be measured.

When multiple dies are used in one package structure and electrical signals on the multiple dies need to be interconnected, pads are usually provided above the dies for interconnection, and there are two main manners of packaging.

The first manner is to place two dies horizontally in a package structure, with pads being interconnected by metal wires (such as copper wires). However, due to sequences of the pads of the two dies that need to be interconnected being different, the metal wires may cross when interconnections are formed, thereby increasing the risk of.

In order to avoid crossing of metal wires, a metal layer needs to be provided on one of the dies, so that wire layouts which allow for changes in the positions and sequence of the pads on the die can be arranged in the metal layer, thereby forming the interconnections while avoiding wire-crossing. However, the size of the package structure of this manner is relatively large, and an additional metal layer needs to be added on the die, resulting in increased cost. Moreover, when signals transmitted by the interconnections of the two dies are high-speed signals (e.g., higher than 1 Gpbs), it is almost impossible to provide additional signal test points due to limited interconnection space in the metal layer and the inability to design branches for the high-speed signals.

The second manner is to stack two dies with each other. However, this manner is limited by the fact that a metal layer disposed on the die can only provide one wiring layer. When multiple pads are required for interconnection, an area of the metal layer needs to be increased, causing dies above the stack to float, so that an additional dummy die layer needs to be added in order to fill a vacant space formed thereby. Although the size of the package structure can be reduced in this manner, it cannot effectively address issues that are present in the first manner, such as the inability to provide the additional signal test points and the increase in cost.

SUMMARY OF THE DISCLOSURE

In response to the above-referenced technical inadequacies, the present disclosure provides a die package structure and a method for fabricating the same.

In one aspect, the present disclosure provides a method for fabricating a die package structure, and the method includes: fixing a first die on a package base; disposing a flexible printed circuit board on the first die, aligning a plurality of first hollow pads of the flexible printed circuit board with a plurality of first pads of the first die, respectively, and fixing the flexible printed circuit board in position; soldering the plurality of first hollow pads to the plurality of first pads, respectively; fixing a second die on the flexible printed circuit board to overlap with the first die; folding the flexible printed circuit board to form a folded portion, such that a plurality of second hollow pads of the flexible printed circuit board are aligned with a plurality of second pads of the second die, respectively, and a plurality of signal test pads of the flexible printed circuit board are exposed, in which the plurality of second hollow pads are electrically connected to the plurality of first hollow pads, respectively; fixing the folded portion of the flexible printed circuit board on the second die; soldering the plurality of second hollow pads to the plurality of second pads, respectively; soldering a plurality of metal wires to the plurality of signal test pads, respectively; and soldering a plurality of package pins to the plurality of metal wires, respectively.

In another aspect, the present disclosure provides a die package structure, which includes a package base, a first die, a flexible printed circuit board, a second die, a plurality of metal wires and a plurality of package pins. The first die is disposed on the package base. The flexible printed circuit board has a first part and a second part, the first part is disposed above the first die, and a plurality of first hollow pads of the flexible printed circuit board are aligned with and soldered to connected to a plurality of first pads of the first die, respectively. The second die is disposed on the first part of the flexible printed circuit board and overlaps the first die. The flexible printed circuit board is folded, such that the second part is disposed above the second die, a plurality of second hollow pads of the flexible printed circuit board are aligned with and soldered to a plurality of second pads of the second die, respectively, a plurality of signal test pads of the flexible printed circuit board are exposed, and the plurality of second hollow pads are electrically connected to the plurality of first hollow pads, respectively. The plurality of metal wires are connected to the plurality of signal test pads, respectively. The plurality of package pins are connected to the plurality of metal wires, respectively.

Therefore, in the die package structure and the method for fabricating the same, a flexible printed circuit board having a plurality of hollow pads that are suitably arranged can be folded, so as to provide signal test points on electrical paths between two dies; a volume of the package structure can be reduced, and the cost associated therewith can also be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
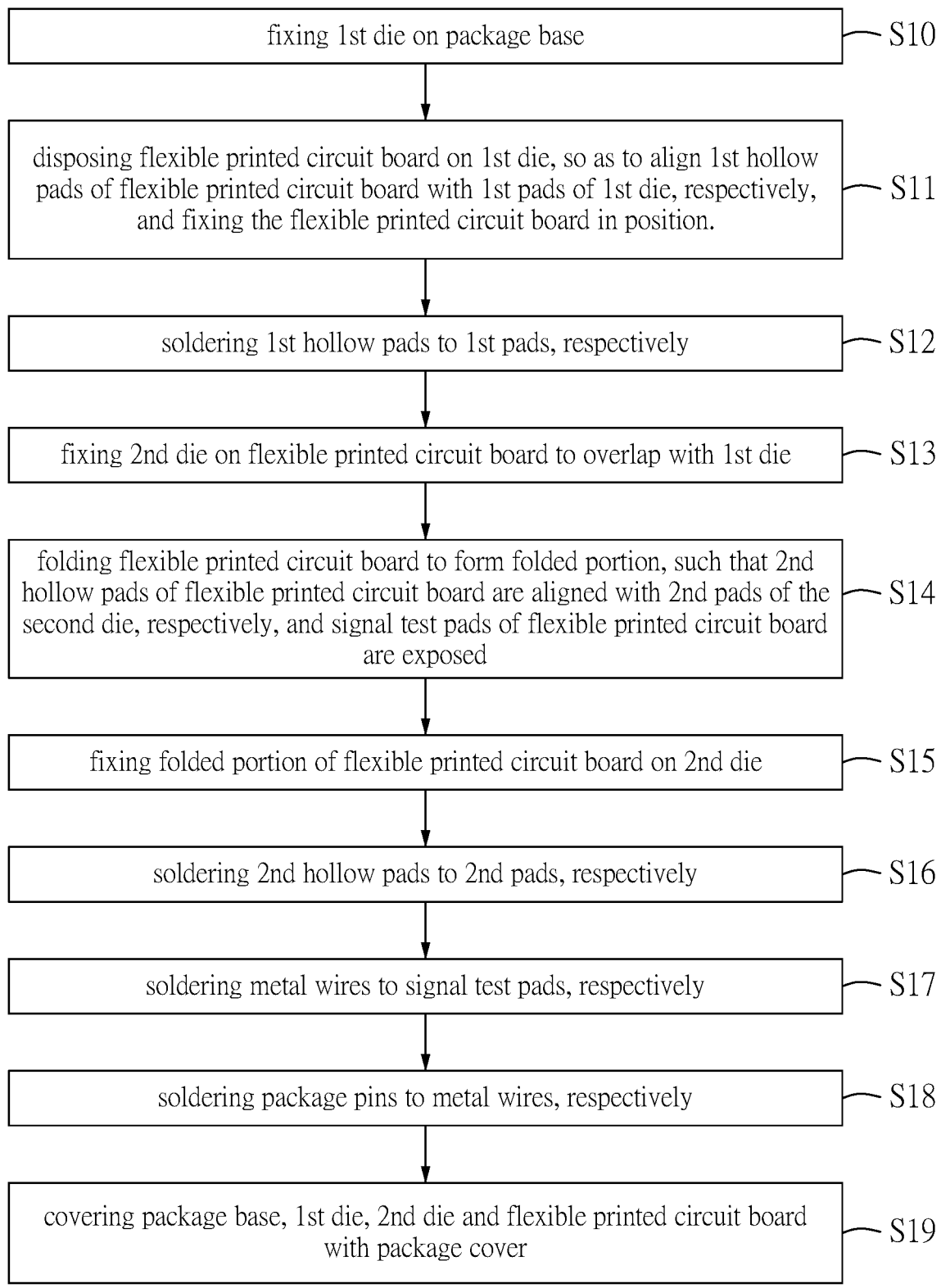
FIG. 1 is a flowchart of a method for fabricating a die package structure according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
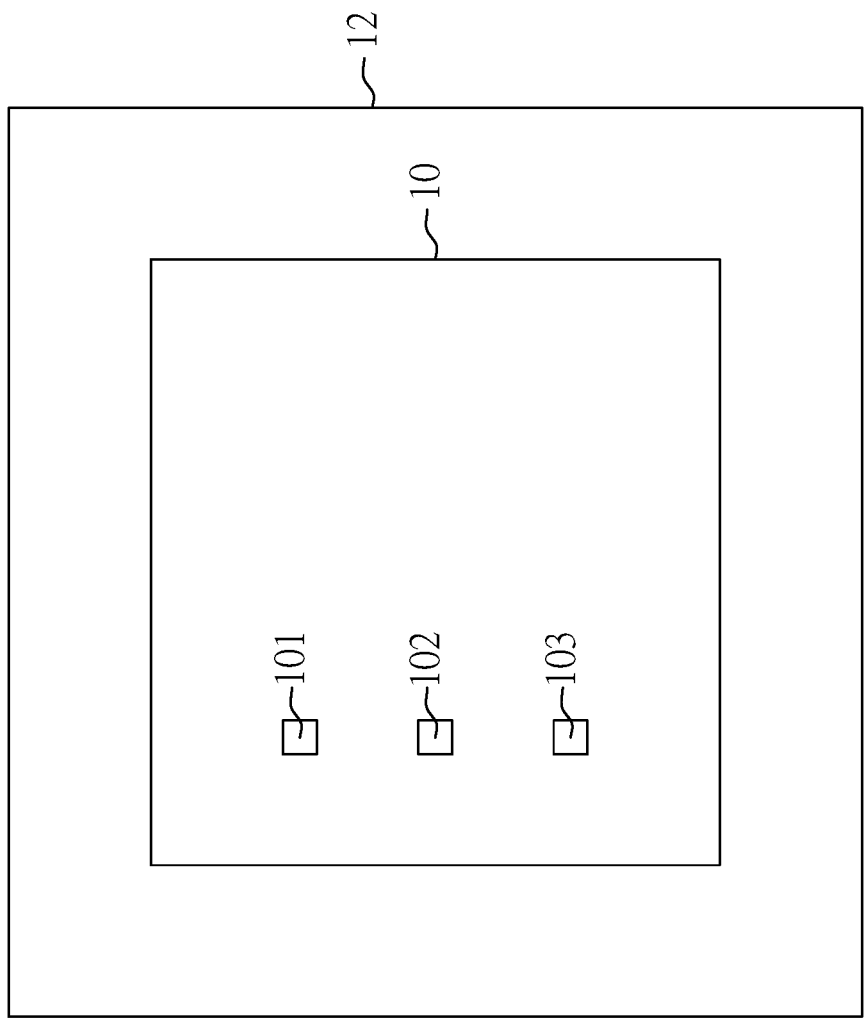
FIG. 2 is a schematic top view of step S10 according to one embodiment of the present disclosure.

FIG. 1 is a flowchart of a method for fabricating a die package structure according to one embodiment of the present disclosure. Referring to FIG. 1, one embodiment of the present disclosure provides a method for fabricating a die package structure, and the method includes the following steps:

Step S10: fixing a first die on a package base. Referring to FIG. 2, which is a schematic top view of step S10 according to one embodiment of the present disclosure. In FIG. 2, the first die 10 can be, for example, a bare die, which is a small piece of integrated circuit made of semiconductor material that is not packaged, on which a plurality of first pads, such as first pads 101, 102, 103, are disposed. The plurality of first pads are used for signal transmission between the first die 10 and external components. The first die 10 is fixed on a package base 12 by utilizing a common die bonding process, for example, by applying glue, heat, pressure, or ultrasonic waves. The package base 12 can be, for example, an integrated circuit base with a square frame structure. Generally, a plurality of holes are reserved at edges of the integrated circuit base for disposing electrical pins.

Step S11: disposing a flexible printed circuit board on the first die, so as to align a plurality of first hollow pads of the flexible printed circuit board with a plurality of first pads of the first die, respectively, and fixing the flexible printed circuit board in position.

Figure 3A:
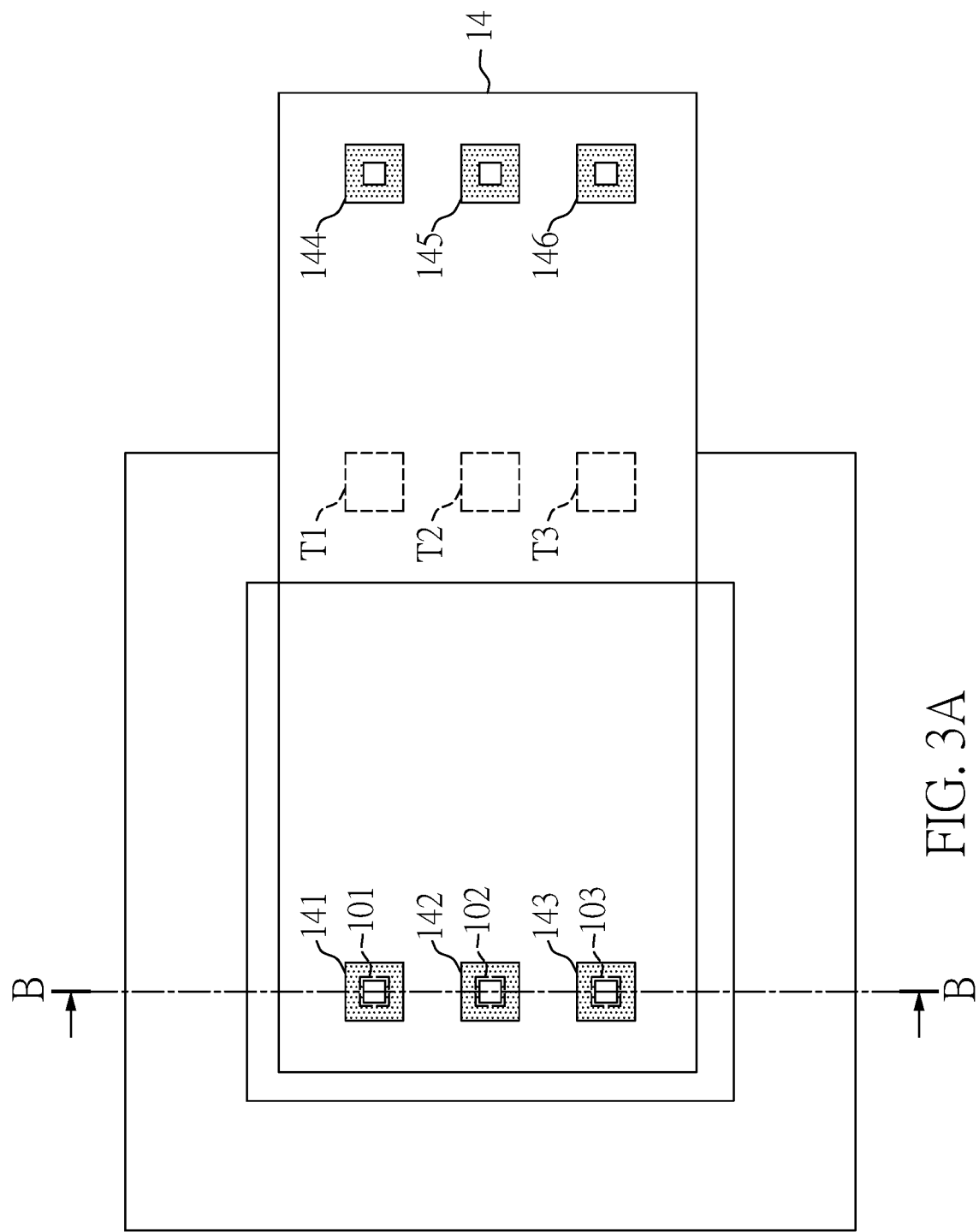
FIG. 3A is a schematic top view of step S11 according to one embodiment of the present disclosure.
Figure 3B:
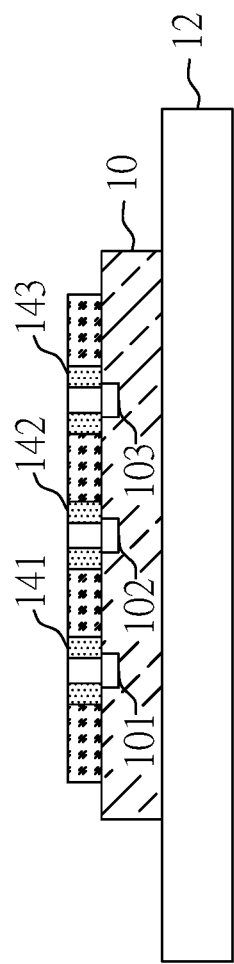
FIG. 3B is a schematic cross-sectional view of step S11 according to one embodiment of the present disclosure.
Figure 4A:
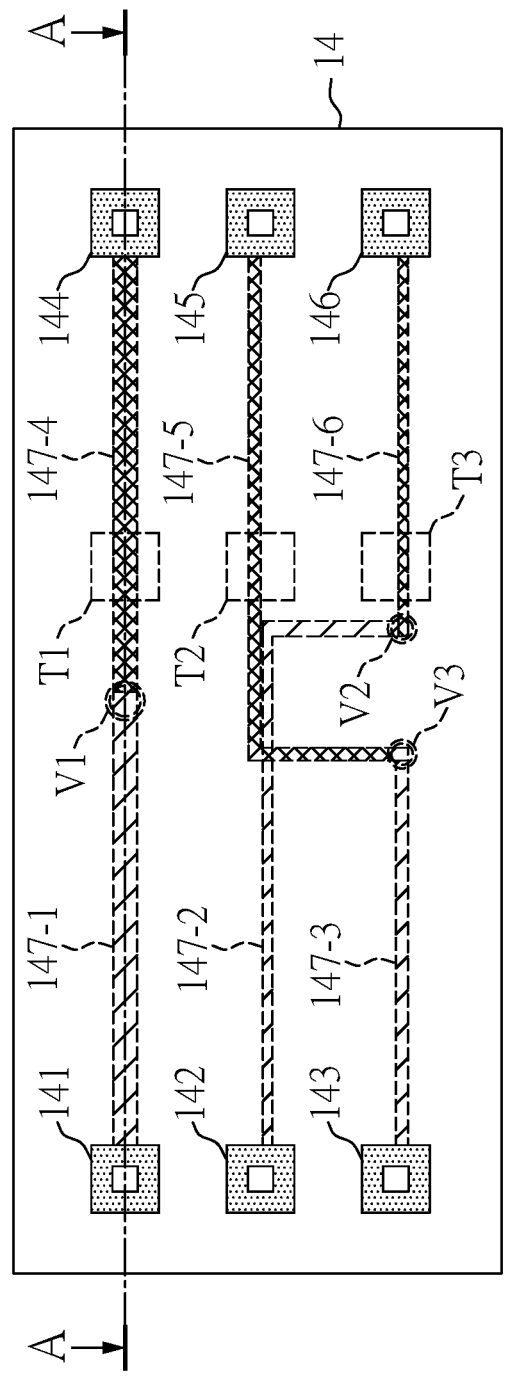
FIG. 4A is a schematic top view of a flexible printed circuit board according to one embodiment of the present disclosure.
Figure 4B:
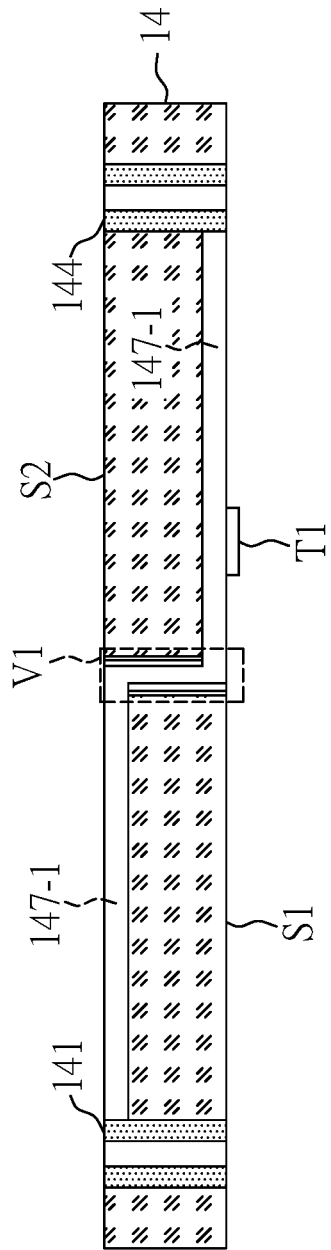
FIG. 4B is a schematic cross-sectional view of a flexible printed circuit board according to one embodiment of the present disclosure.

Referring to FIGS. 3A, 3B, 4A and 4B together. FIG. 3A is a schematic top view of step S11 according to one embodiment of the present disclosure, FIG. 3B is a schematic cross-sectional view of step S11 according to one embodiment of the present disclosure, FIG. 4A is a schematic top view of a flexible printed circuit board according to one embodiment of the present disclosure, and FIG. 4B is a schematic cross-sectional view of a flexible printed circuit board according to one embodiment of the present disclosure.

Referring to FIGS. 4A and 4B first, the flexible printed circuit board 14 has a first surface S1 in contact with the first die 10 and a second surface S2 opposite to the first surface S1. The flexible printed circuit board 14 can include, for example, a copper foil substrate, a core layer (e.g., polyimide) and a protective film for surface insulation.

As shown in FIG. 4A and the cross-sectional view of FIG. 4B along a section line A-A, the flexible printed circuit board 14 has a plurality of first hollow pads (e.g., first hollow pads 141, 142, 143) and a plurality of second hollow pads (e.g., second hollow pads 144, 145, 146). The first hollow pads 141, 142, 143 are disposed in the flexible printed circuit board 14 and penetrate through the first surface S1 and the second surface S2.

From the top view of FIG. 4A, each of the first hollow pads 141, 142, and 143 includes a first rectangular loop-shaped metal, and a size of an inner ring of the first rectangular loop-shaped metal is smaller than a size of the corresponding first pad, and a size of an outer ring of the first rectangular loop-shaped metal is larger than the size of the corresponding first pad. For example, the first hollow pad 141 is to be aligned with the first pad 101, and an area of the inner loop, that is, an area of a hollow portion, is smaller than an area of the first pad 101, and an area of the outer loop (a rectangle formed by outer edges) is larger than the area of the first pad 101.

On the other hand, the second hollow pads 144, 145 and 146 are electrically connected to the first hollow pads 141, 143 and 142, respectively. Similarly, the second hollow pads 144, 145, and 146 are disposed in the flexible printed circuit board 14 and penetrate through the first surface S1 and the second surface S2, and are electrically connected to the first hollow pads 141, 143, 142 through a plurality of metal traces 147-1, 147-2, 147-3, 147-4, 147-5, 147-6 in the flexible printed circuit board 14, respectively.

In some embodiments, although the second hollow pads 144, 145, and 146 correspond to the first hollow pads 141, 142, and 143 in sequence in a specific direction, in order to meet circuit design requirements, the second hollow pads 144, 145, and 146 need to be electrically connected to the first hollow pads 141, 143, and 142 in sequence, respectively, such that the first pads 101, 102, and 103 on the first die 10 can be connected to specific pads.

In addition, the metal traces 147-1, 147-2, and 147-3 are top metal traces in the flexible printed circuit board 14, and the metal traces 147-4, 147-5, and 147-6 are bottom metal traces in the flexible printed circuit board 14. The metal trace 147-1 is electrically connected to the metal trace 147-4 through a via V1, the metal trace 147-2 is electrically connected to the metal trace 147-6 through a via V2, and the metal trace 147-3 is electrically connected to the metal trace 147-5 through a via V3. In this way, signal paths can be provided without use of an additional metal layer. In a case where a large number of signal lines are included, the flexible printed circuit board 14 can be provided with more than 4 or 6 layers of metal planes therein for signal connection. In other words, the above-mentioned metal traces 147-1, 147-2, 147-3 are not limited to the top metal traces, and the metal traces 147-4, 147-5, 147-6 are also not limited to the bottom metal traces. That is, all metal planes in the flexible printed circuit board 14 can be used for signal connections.

Furthermore, signal test pads T1, T2 and T3 are respectively located on electrical paths formed by the metal traces 147-4, 147-5 and 147-6, respectively, and are located on the first surface S1 of the flexible printed circuit board 14. It should be noted that, on the first side S1, a protective layer generally covers the metal traces 147-4, 147-5, and 147-6 for insulation protection, and the protective layer can reserve a plurality of exposed areas for the signal test pads T1, T2 and T3 to respectively electrically connected to the metal traces 147-4, 147-5 and 147-6.

Next, reference can be made to the top view of FIG. 3A and the cross-sectional view of FIG. 3B along a section line B-B. As shown in FIGS. 3A and 3B, when a portion (a first part) of the flexible printed circuit board 14 is disposed above the first die 10, the first pads 101, 102, and 103 are aligned to the first hollow pads 141, 142, and 143, respectively.

Step S12: soldering the plurality of first hollow pads to the plurality of first pads, respectively.

Referring to FIG. 3B, solder can be poured into hollows of the first hollow pads 141, 142, 143, and the first hollow pads 141, 142, 143 can be soldered to the first pads 101, 102, and 103, respectively, by performing a soldering process. In addition, any method for electrically connecting the first hollow pads 141, 142, and 143 to the first pads 101, 102, and 103 can also be used, and the present disclosure is not limited thereto. Since the size of the inner loop of the first rectangular loop-shaped metal is smaller than the size of the corresponding first pad, and the size of the outer loop of the first rectangular loop-shaped metal is larger than the size of the corresponding first pad, when the soldering is completed, excellent electrical contact can be afforded between the first hollow pads 141, 142, 143 and the first pads 101, 102, 103, and a probability of soldering failure can be reduced.

Step S13: fixing a second die on the flexible printed circuit board to overlap with the first die.

Figure 5:
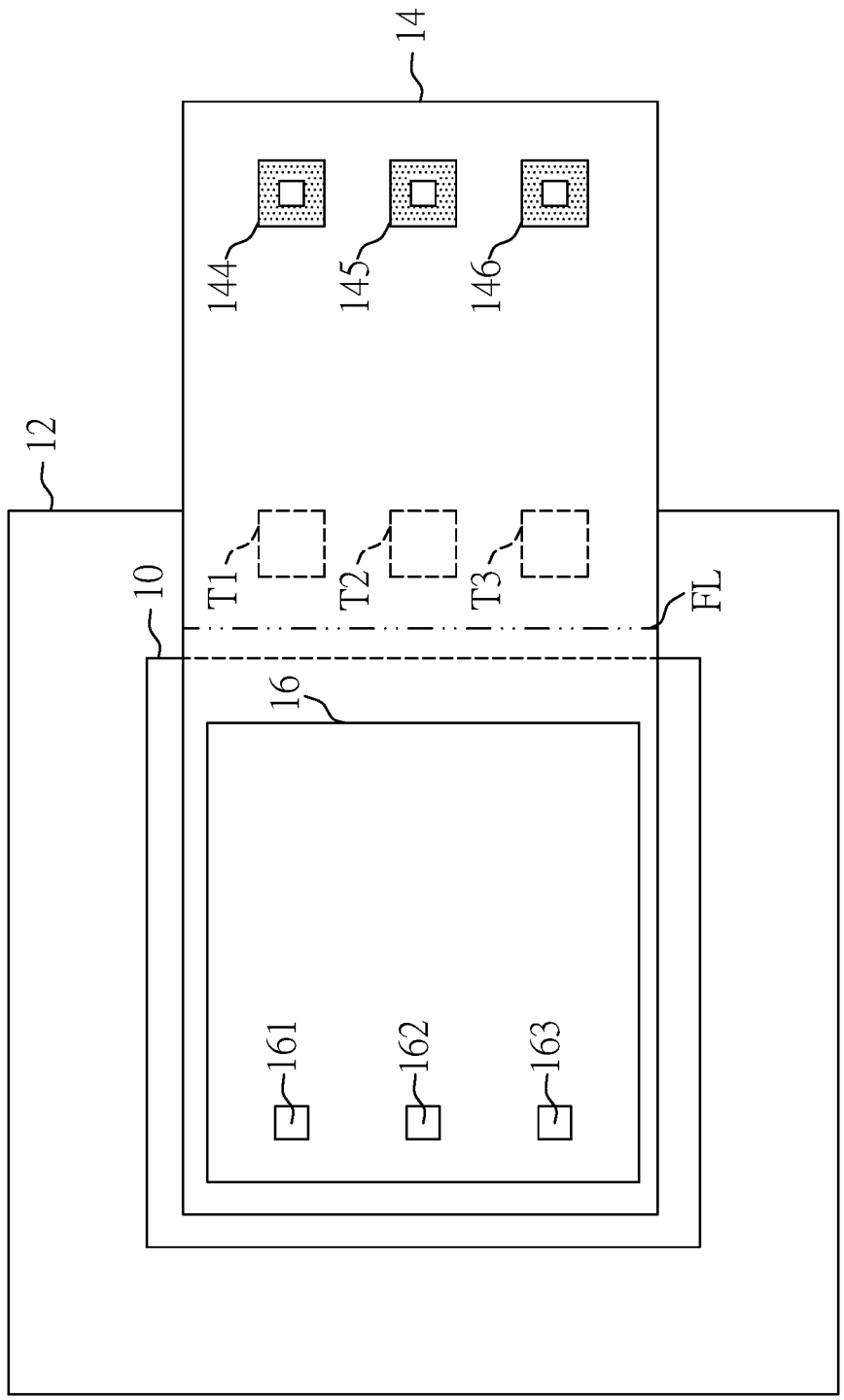
FIG. 5 is a schematic top view of step S13 according to one embodiment of the present disclosure.

Referring to FIG. 5, which is a schematic top view of step S13 according to one embodiment of the present disclosure. As shown in FIG. 5, a fixing material, such as epoxy molding compound, can be applied on the flexible printed circuit board 14 to fix the second die 16 on the second surface S2 of the flexible printed circuit board 14. Similar to the first die 10, the second die 16 can be, for example, a bare die, which is a small piece of integrated circuit body made of a semiconductor material and is not packaged, on which a plurality of second pads, such as second pads 161, 162 and 163, are disposed. The plurality of second pads are used for signal transmissions between the second die 16 and the first die 10 or external components. It should be noted that positions of the second pads 161, 162, and 163 in FIG. 5 are only for illustration, and are not limited to being disposed on the leftmost side of the second die 16. From the top view, vertical projection areas of the second die 16 and the first die 10 overlap, and since the two dies are overlapped with each other, an overall area used by the package structure can be reduced.

Step S14: folding the flexible printed circuit board to form a folded portion, such that a plurality of second hollow pads of the flexible printed circuit board are aligned with a plurality of second pads of the second die, respectively, and a plurality of signal test pads of the flexible printed circuit board are exposed.

Figure 6A:
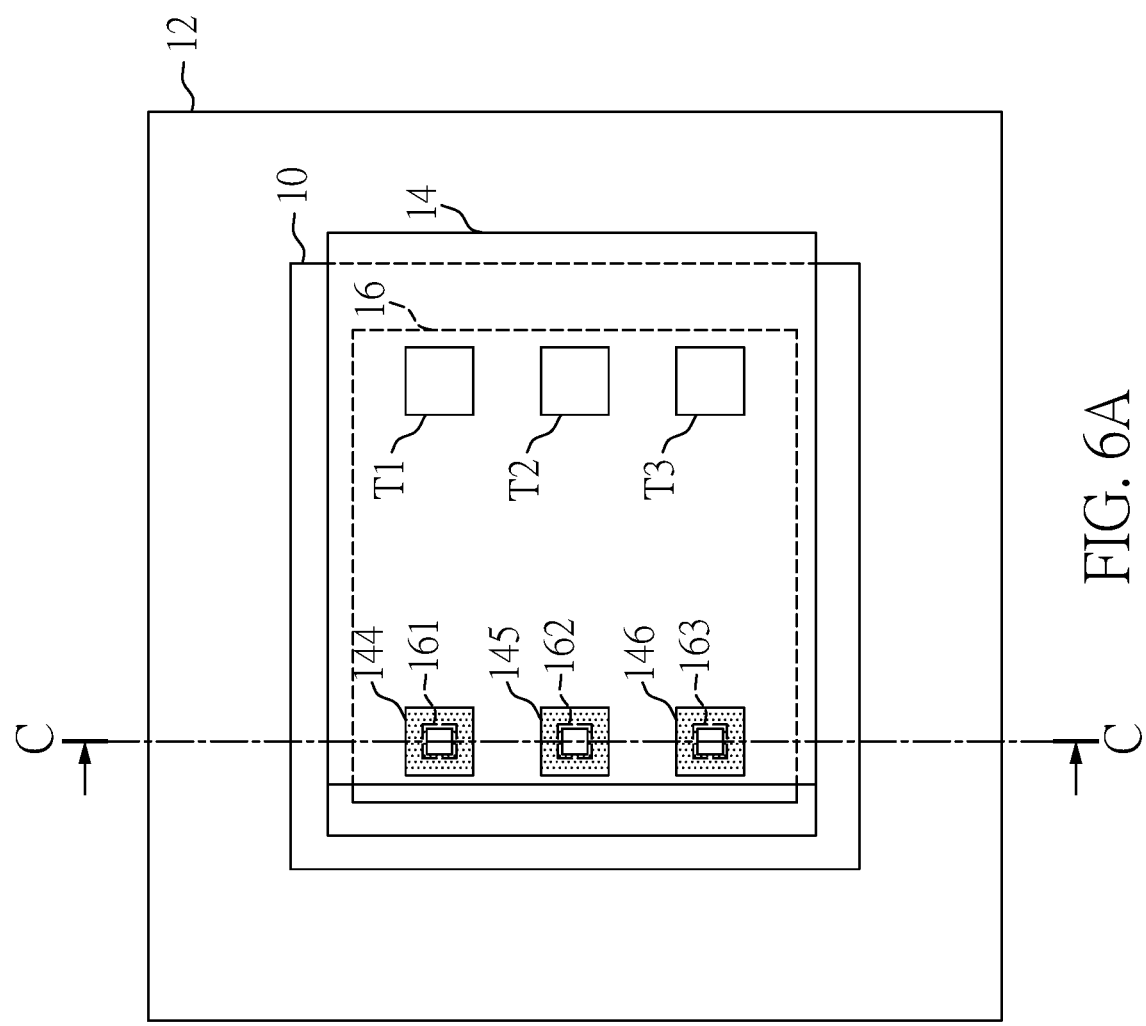
FIG. 6A is a schematic top view of step S14 according to one embodiment of the present disclosure.
Figure 6B:
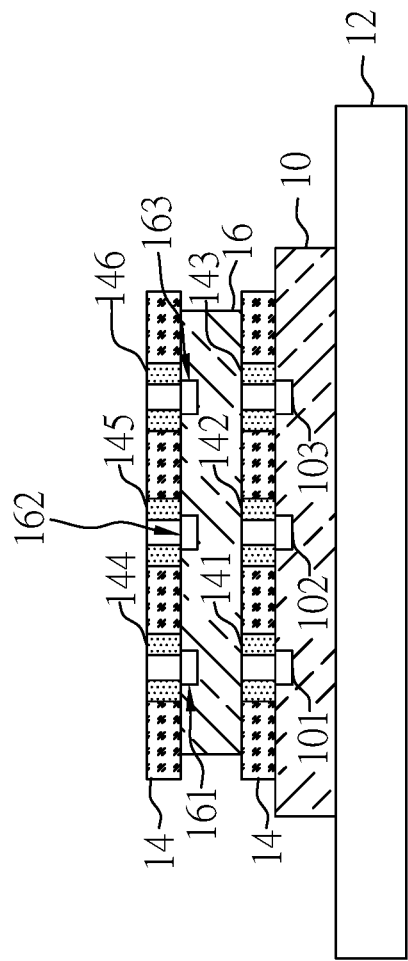
FIG. 6B is a schematic cross-sectional view of step S14 according to one embodiment of the present disclosure.

Referring to FIGS. 5, 6A and 6B together. FIG. 6A is a schematic top view of step S14 according to one embodiment of the present disclosure, and FIG. 6B is a schematic cross-sectional view of step S14 according to one embodiment of the present disclosure.

As shown in FIG. 5, similar to the first hollow pads 141, 142, 143, the second hollow pads 144, 145, and 146 each include a second rectangular loop-shaped metal, a size of an inner loop of the second rectangular loop-shaped metal is smaller than a size of the corresponding second pad, and a size of an outer loop of the second rectangular loop-shaped metal is larger than the size of the corresponding second pad. For example, the second hollow pad 144 is to be aligned with the second pad 161, and an area of the inner loop, that is, an area of a hollow portion, is smaller than an area of the second pad 161, and an area of the outer loop (a rectangle formed by outer edges of the second rectangular loop-shaped metal) is larger than the area of the second pad 161.

Next, referring to FIG. 6A and FIG. 6B taken along a cross-sectional line CC, after a right part (second part) of the flexible printed circuit board 14 is folded to the left along a fold line FL of FIG. 5, so as to align the second hollow pads 144, 145, 146 with the second pads 161, 162, 163, the signal test pads T1, T2, T3 on the first surface S1 is exposed at the top. In other words, even if the first pads 101, 102, 103 and the second pads 161, 162, 163 are blocked due to design requirements, signals can still be tested through the signal test pads T1, T2, T3 without provide additional test paths for the first pads 101, 102, 103 and the second pads 161, 162, 163.

It should be noted that positions of the signal test pads T1, T2, and T3 can be adjusted according to actual applications. For example, when more than two dies are stacked, if the test pads T1, T2, T3 are directly above one of the two dies, the test pads T1, T2, T3 may be blocked by the upper die. Therefore, the signal test pads T1, T2, T3 can be arranged at the folding line FL of the flexible printed circuit board 14, that is, a side of the entire stack of the dies, for example, positions corresponding to the first hollow pads 141, 142 in FIG. 6B. The advantage is that even if a plurality of die are stacked, the signal test pads T1, T2, and T3 can still be drawn out through metal wires from a side of the stack of the plurality of dies for testing.

Step S15: fixing the folded portion of the flexible printed circuit board on the second die.

In detail, this step is to fix a part of the flexible printed circuit board 14 above the second die 16 on the second die 16, for example, glue, heat, pressure or ultrasonic waves can be applied to fix the flexible printed circuit board 14 on the second die 16.

Step S16: soldering the plurality of second hollow pads to the plurality of second pads, respectively.

Referring to FIG. 6B, solder can be poured into hollows of the second hollow pads 144, 145, 146, and the second hollow pads 144, 145, and 146 can be soldered to the second pads 161, 162, 163, respectively, by performing a soldering process. In addition, any method for electrically connecting the second hollow pads 144, 145, and 146 to the second pads 161, 162, 163 can also be used, and the present disclosure is not limited thereto. Since the size of the inner loop of the second rectangular loop-shaped metal is smaller than the size of the corresponding second pad, and the size of the outer loop of the second rectangular loop-shaped metal is larger than the size of the corresponding second pad, when the soldering is completed, excellent electrical contacts between the second hollow pads 141, 142, 143 and the first pads 101, 102, 103 can therefore be ensured, and a probability of soldering failure can be reduced.

Step S17: soldering a plurality of metal wires to the plurality of signal test pads, respectively.

Step S18: soldering a plurality of package pins to the plurality of metal wires, respectively.

Figure 7:
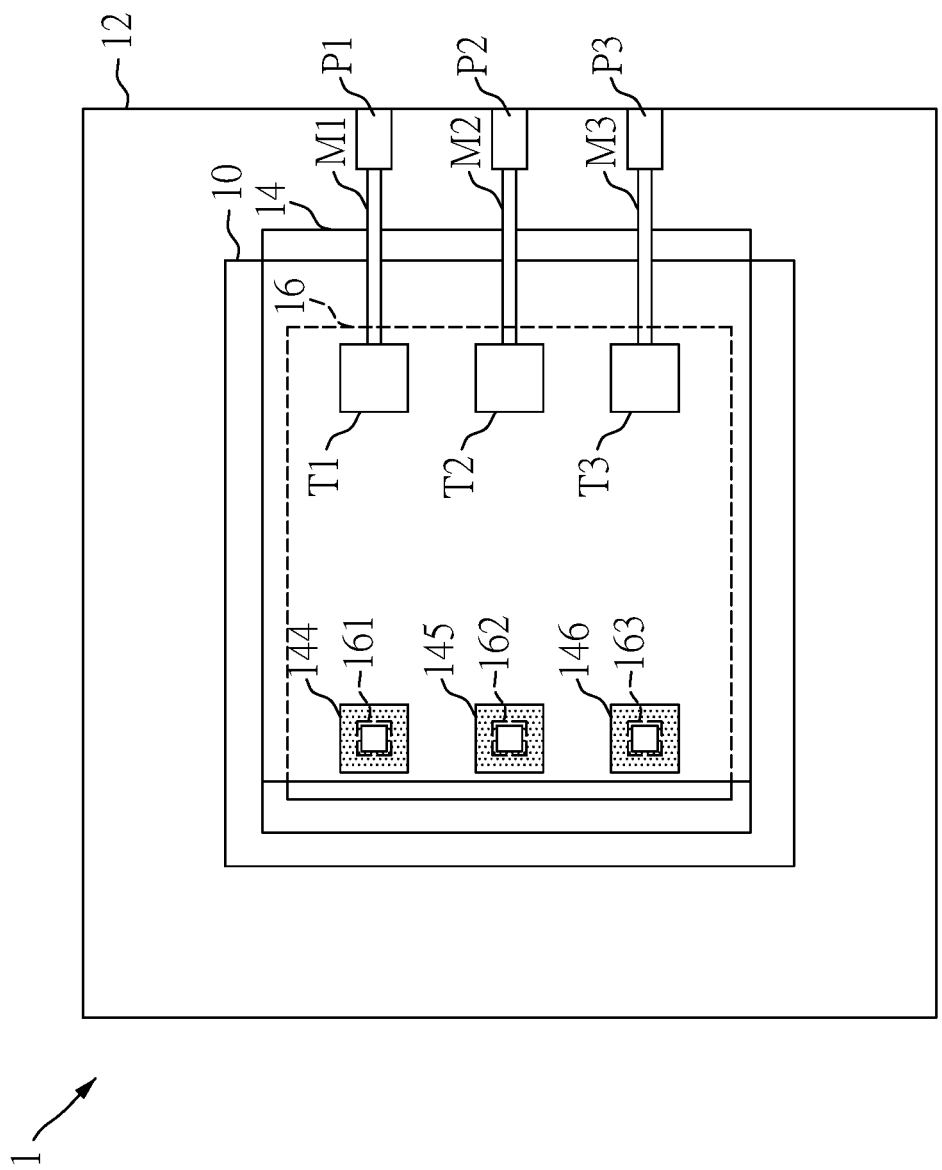
FIG. 7 is a schematic top view of steps S17 and S18 according to one embodiment of the present disclosure.

Referring to FIG. 7, which is a schematic top view of steps S17 and S18 according to one embodiment of the present disclosure. For example, metal wires M1, M2, M3 can be respectively arranged from the signal test pads T1, T2, T3 to the outside by bonding, and package pins P1, P2, P3 are soldered to the metal wires M1, M2, M3, respectively. The metal wires M1, M2, M3 can be, for example, copper wires, but the present disclosure is not limited thereto. In a specific test application, the metal wires M1, M2, and M3 can be not soldered to the package pins P1, P2, and P3. Instead, the metal wires M1, M2, and M3 can be directly extended to the outside of the package for signal testing.

Herein, the present disclosure also provides a die package structure 1, which is formed by the process of FIG. 1 and shown in FIG. 7. The die package structure 1 includes a package base 12, a first die 10, a second die 16 and a flexible printed circuit board 14. The arrangement of the package base 12, the first die 10, the second die 16 and the flexible printed circuit board 14 is described above, and is not repeated hereinafter. It should be noted that the die package structure and the method for fabricating the same of the present disclosure are not limited to two dies, and can also be applied to a stack of multiple dies.

Figure 8:
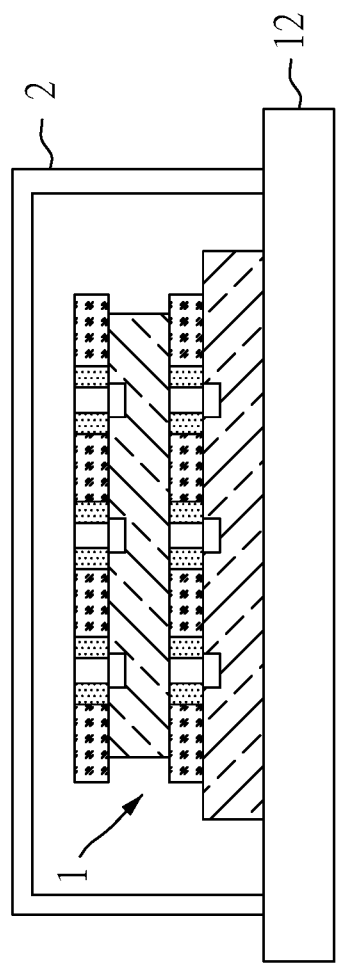
FIG. 8 is a schematic cross-sectional view of step S19 according to an embodiment of the present disclosure.

Further referring to FIG. 1, a user can continue to stack up with a similar structure according to requirements, or can refer to FIG. 8, which is a schematic cross-sectional view of step S19 according to an embodiment of the present disclosure. The method for fabricating the die package structure proceeds to step S19: covering the package base, the first die, the second die and the flexible printed circuit board with a package cover. As shown in FIG. 8, a package cover 2 has an accommodating space, which can cover the die package structure 1 and be combined with the package base 12.

BENEFICIAL EFFECTS OF THE EMBODIMENTS

In conclusion, in the die package structure and the method for fabricating the same, a flexible printed circuit board having a plurality of hollow pads that are suitably arranged can be folded, so as to provide signal test points on electrical paths between two dies; a volume of the package structure can be reduced, and the cost associated therewith can also be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for fabricating a die package structure, comprising:
   fixing a first die on a package base;
   disposing a flexible printed circuit board on the first die, aligning a plurality of first hollow pads of the flexible printed circuit board with a plurality of first pads of the first die, respectively, and fixing the flexible printed circuit board in position;
   soldering the plurality of first hollow pads to the plurality of first pads, respectively;
   fixing a second die on the flexible printed circuit board to overlap with the first die;
   folding the flexible printed circuit board to form a folded portion, such that a plurality of second hollow pads of the flexible printed circuit board are aligned with a plurality of second pads of the second die, respectively, and a plurality of signal test pads of the flexible printed circuit board are exposed, wherein the plurality of second hollow pads are electrically connected to the plurality of first hollow pads, respectively;
   fixing the folded portion of the flexible printed circuit board on the second die;
   soldering the plurality of second hollow pads to the plurality of second pads, respectively;
   soldering a plurality of metal wires to the plurality of signal test pads, respectively; and
   soldering a plurality of package pins to the plurality of metal wires, respectively.

2. The method according to claim 1, wherein the flexible printed circuit board has a first surface in contact with the first die and a second surface opposite to the first surface, and the plurality of first hollow pads are disposed in the flexible printed circuit board and penetrate through the first surface and the second surface.

3. The method according to claim 2, wherein the step of fixing the second die on the flexible printed circuit board further includes fixing the second die on the second surface of the flexible printed circuit board, such that the second die overlaps with a vertical projection area of the first die on the flexible printed circuit board.

4. The method according to claim 2, wherein the step of folding the flexible printed circuit board further includes folding the flexible printed circuit board such that the plurality of signal test pads on the first surface are exposed.

5. The method according to claim 2, wherein the plurality of second hollow pads are disposed in the flexible printed circuit board and penetrate through the first surface and the second surface, and the plurality of second hollow pads are electrically connected to the plurality of first hollow pads through a plurality of metal traces in the flexible printed circuit board, respectively, and the plurality of signal test pads are respectively located on a plurality of electrical paths formed by the plurality of metal traces.

6. The method according to claim 1, wherein the step of fixing the flexible printed circuit board on the second die further includes fixing a portion of the flexible printed circuit board, that is located above the second die, on the second die.

7. The method according to claim 2, wherein each of the plurality of first hollow pads includes a first rectangular loop-shaped metal, a size of an inner ring of the first rectangular loop-shaped metal is smaller than a size of the corresponding first pad, and a size of an outer ring of the first rectangular loop-shaped metal is larger than the size of the corresponding first pad.

8. The method according to claim 2, wherein each of the plurality of first hollow pads includes a second rectangular loop-shaped metal, a size of an inner ring of the second rectangular loop-shaped metal is smaller than a size of the corresponding second pad, and a size of an outer ring of the second rectangular loop-shaped metal is larger than the size of the corresponding second pad.

9. A die package structure, comprising:
a package base;
a first die, disposed on the package base;
a flexible printed circuit board having a first part and a second part, wherein the first part is disposed above the first die, and a plurality of first hollow pads of the flexible printed circuit board are aligned with and soldered to a plurality of first pads of the first die, respectively;
a second die disposed on the first part of the flexible printed circuit board and overlapping the first die, wherein the flexible printed circuit board is folded, such that the second part is disposed above the second die, a plurality of second hollow pads of the flexible printed circuit board are aligned with and soldered to a plurality of second pads of the second die, a plurality of signal test pads of the flexible printed circuit board are exposed, and the plurality of second hollow pads are electrically connected to the plurality of first hollow pads, respectively;
a plurality of metal wires connected to the plurality of signal test pads, respectively; and
a plurality of package pins connected to the plurality of metal wires, respectively.

10. The die package structure according to claim 9, wherein the flexible printed circuit board has a first surface in contact with the first die and a second surface opposite to the first surface, and the plurality of first hollow pads are disposed in the flexible printed circuit board and penetrate through the first surface and the second surface.

11. The die package structure according to claim 10, wherein the second die is fixed on the second surface of the flexible printed circuit board, such that the second die overlaps with a vertical projection area of the first die on the flexible printed circuit board.

12. The die package structure according to claim 10, wherein the flexible printed circuit board is folded, such that the plurality of signal test pads on the first surface are exposed.

13. The die package structure according to claim 10, wherein the plurality of second hollow pads are disposed in the flexible printed circuit board and penetrate through the first surface and the second surface, and the plurality of second hollow pads are electrically connected to the plurality of first hollow pads through a plurality of metal traces in the flexible printed circuit board, respectively, and the plurality of signal test pads are respectively located on a plurality of electrical paths formed by the plurality of metal traces.

14. The die package structure according to claim 9, wherein the second portion of the flexible printed circuit board is located above the second die, and is fixed on the second die.

15. The die package structure according to claim 10, wherein each of the plurality of first hollow pads includes a first rectangular loop-shaped metal, a size of an inner ring of the first rectangular loop-shaped metal is smaller than a size of the corresponding first pad, and a size of an outer ring of the first rectangular loop-shaped metal is larger than the size of the corresponding first pad.

16. The die package structure according to claim 10, wherein each of the plurality of first hollow pads includes a second rectangular loop-shaped metal, a size of an inner ring of the second rectangular loop-shaped metal is smaller than a size of the corresponding second pad, and a size of an outer ring of the second rectangular loop-shaped metal is larger than the size of the corresponding second pad.

* * * * *